US008349712B2

(12) United States Patent
Strittmatter et al.

(10) Patent No.: US 8,349,712 B2
(45) Date of Patent: Jan. 8, 2013

(54) LAYER ASSEMBLY

(75) Inventors: André Strittmatter, Berlin (DE); Andrei Schliwa, Berlin (DE); Tim David Germann, Berlin (DE); Udo W. Pohl, Berlin (DE); Vladimir Gaysler, Novosibirsk (RU); Jan-Hindrik Schulze, Berlin (DE)

(73) Assignee: Technische Universitat Berlin, Berlin (DE)

( * ) Notice: Subject to any disclaimer, the term of this patent is extended or adjusted under 35 U.S.C. 154(b) by 40 days.

(21) Appl. No.: 13/076,166

(22) Filed: Mar. 30, 2011

(65) Prior Publication Data
US 2012/0248403 A1 Oct. 4, 2012

(51) Int. Cl.
*H01L 21/20* (2006.01)
*H01L 21/36* (2006.01)

(52) U.S. Cl. ..... 438/478; 438/22; 438/46; 257/E33.069; 372/45.011

(58) Field of Classification Search .......... 438/22, 438/29, 39, 46, 478; 257/E33.069; 372/45.01, 372/45.011
See application file for complete search history.

(56) References Cited

U.S. PATENT DOCUMENTS

| | | | |
|---|---|---|---|
| 5,493,577 A * | 2/1996 | Choquette et al. | 372/46.013 |
| 5,822,356 A * | 10/1998 | Jewell | 372/98 |
| 6,014,395 A * | 1/2000 | Jewell | 372/45.01 |
| 6,407,407 B1 * | 6/2002 | Johnson et al. | 257/18 |
| 6,589,805 B2 * | 7/2003 | Zhu et al. | 438/22 |
| 6,765,943 B2 * | 7/2004 | Jewell | 372/46.013 |
| 6,782,021 B2 * | 8/2004 | Huang et al. | 372/45.013 |
| 6,931,042 B2 * | 8/2005 | Choquette et al. | 372/43.01 |
| 7,068,696 B2 * | 6/2006 | Ezaki et al. | 372/46.01 |
| 2001/0050934 A1 * | 12/2001 | Choquette et al. | 372/43 |
| 2002/0131462 A1 * | 9/2002 | Lin et al. | 372/43 |
| 2002/0167985 A1 * | 11/2002 | Shinagawa et al. | 372/50 |
| 2002/0177250 A1 * | 11/2002 | Zhu et al. | 438/42 |
| 2004/0081215 A1 * | 4/2004 | Johnson et al. | 372/45 |
| 2004/0233954 A1 * | 11/2004 | Hayakawa | 372/45 |
| 2008/0212633 A1 * | 9/2008 | Shimizu et al. | 372/45.011 |

OTHER PUBLICATIONS

Atkinson, P. et al. "Site-controlled growth and luminescence of InAs quantum dots using in situ Ga-assisted deoxidation of patterned substrates", Applied Physics Letters, 2008, vol. 93, pp. 101908-1 to 101908-3.
Baier, M. et al. "Single photon emission from site-controlled pyramidal quantum dots", Applied Physics Letters, Feb. 2, 2004, vol. 84, No. 5, pp. 648-650.
Barth, J. et al. "Engineering atomic and molecular nanostructures at surfaces", Nature, Sep. 29, 2005, vol. 437, pp. 671-679.
Hsieh, T. et al. "Single photon emission from an InGaAs quantum dot precisely positioned on a nanoplane", Applied Physics Letters, 2007, vol. 90, pp. 073105-1 to 073105-3.
Mehta, M. et al. "Focused ion beam implantation induced site-selective growth of InAs quantum dots", Applied Physics Letters, 2007, vol. 91, pp. 123108-1 to 123108-3.

* cited by examiner

*Primary Examiner* — Leonard Chang
(74) *Attorney, Agent, or Firm* — Foley & Lardner LLP

(57) ABSTRACT

The invention inter alia relates to a method of fabricating a layer assembly comprising the steps of: arranging a first layer on top of a carrier; arranging a second layer on top of the first layer; locally modifying the material of the buried first layer and providing at least one modified section in the first layer, wherein the modified material changes or induces mechanical strain in a portion of the second layer which is arranged above the at least one modified section; after locally modifying the material of the buried first layer, depositing a third material on top of the second layer, at least one characteristic of the third material being sensitive to the local mechanical strain in the second layer.

17 Claims, 8 Drawing Sheets

LAYER ASSEMBLY

The invention relates to layer assemblies and methods for fabricating layer assemblies with a deterministic local arrangement on a surface. More specifically, the invention relates to layer assemblies with at least one locally arranged nanostructure. Hereinafter, the term "nanostructure" refers to structures having a size (diameter) of less than 1 µm.

BACKGROUND OF THE INVENTION

Atkinson et al. (Applied Physics Letters, 93, 101908 (2008)) describes the growth of nanostructures on a pre-structured surface. A local arrangement of single and pairs of InAs quantum dots at ex situ defined nanometer sized holes during growth is demonstrated using a GaAs(001) substrate surface which is patterned by electron-beam photolithography and dry etching.

So far, the step of pre-patterning the surface to obtain local arrangement of nanostructures is done using complex patterning techniques like electron beam lithography, focussed ion beam etching, ion implantation and the like. The direct surface patterning may cause crystal damages and defects that may have negative impacts on the quality and performance of nanostructures made thereon. Long-range impact of the patterning along the surface normal of a substrate is useful as it enables the separation of the nanostructures from patterning-induced defects.

OBJECTIVE OF THE PRESENT INVENTION

An objective of the present invention is to provide a method for fabricating nanostructures with a deterministic local arrangement on a surface and having an improved performance.

A further objective of the present invention is to provide a device having at least one nanostructure with increased performance compared to prior art devices.

BRIEF SUMMARY OF THE INVENTION

An embodiment of the present invention relates to a method of fabricating a layer assembly comprising the steps of:
  arranging a first layer on top of a carrier;
  arranging a second layer on top of the first layer;
  locally modifying the material of the buried first layer and providing at least one modified section in the first layer, wherein the modified material changes or induces mechanical strain in a portion of the second layer which is arranged above the at least one modified section;
  after locally modifying the material of the buried first layer, depositing a third material on top of the second layer, at least one characteristic of the third material being sensitive to the local mechanical strain in the second layer.

An advantage of this embodiment of the invention is that the second layer, even if unstructured, exhibits a locally modified characteristic due to strain caused by the buried first layer. As such, the third material, which is deposited thereon, may for instance create one or more nanostructures even on an unstructured surface. The localisation of the nanostructures may simply be caused by the local strain in the second layer.

The strain-sensitive characteristic of the third material preferably relates to at least one of the following: thickness, composition, shape, electronic band structure, crystal growth.

According to a preferred embodiment, a portion of the second layer is removed to expose a portion of the buried first layer. For instance, an edge face or side facet of the buried first layer may be exposed.

After partly exposing the buried first layer, the exposed portion (e.g. edge face or side facet) may be chemically modified by applying at least one chemical, prior to depositing the strain-sensitive third material.

The carrier and all layers are preferably crystalline prior to the local modification of the buried first layer.

At least one nanostructure is preferably formed on top of the second layer in an area, which is located above an unmodified section of the first layer or adjacent thereto, by depositing the strain-sensitive third material on the locally strained second layer.

The deposition of the strain-sensitive material may form at least one semiconductor nanostructure with quantized energy levels. For instance, the nanostructures may be quantum wells, quantum wires, or quantum dots.

Preferably, the layer assembly includes at least one nanostructure that forms at least one photon emitter. The photon emitter may be a single photon emitter.

By removing portions of the first and second layers, a mesa structure may be provided that includes the buried first layer and the second layer.

One or more chemicals are preferably applied to the edge face or side facet of the mesa structure, prior to depositing the third material.

The chemicals preferably modify the material of the buried first layer in an outer section adjacent to the outer surface of the mesa structure, said outer section embracing an inner section of the mesa structure. The material of the buried first layer in the inner section of the mesa structure, however, remains unchanged.

The inner contour of the outer section preferably exhibits at least one corner. A corner in the contour marks a point of very high strain in the second layer, and thus supports the local arrangement of nanostructures during deposition. The inner contour may exhibit a square, a triangle, a rectangle or any other cornered shape.

The material of the buried first layer in the outer section is preferably oxidized, nitridated, or carbonized.

The modification of the buried first layer in the outer section preferably increases or decreases the volume of the material in the outer section and thereby locally induces mechanical strain inside the second layer.

At least one nanostructure may be formed on top of the second layer in an area, which is located above the inner unmodified section of the first layer or adjacent thereto, by depositing the third material on the locally strained second layer.

Furthermore, electrical contacts are preferably added which allow applying an electrical voltage to the resulting layer assembly.

According to a further preferred embodiment, the modification of the material of the buried first layer in the outer section decreases the electrical conductivity in the outer section such that the inner section of the buried first layer forms a current guiding aperture that is positioned below the at least one nanostructure.

The buried first layer may be an Al(Ga)As-layer. After locally modifying the Al(Ga)As-layer, III/V compound materials may be deposited as third material.

Alternatively, the buried first layer may be an AlInN-layer. After locally modifying the AlInN-layer, III/V compound materials may be deposited as third material.

The carrier is preferably a crystalline silicon substrate or any other substrate which allows epitaxial growth of semiconductors such as sapphire, silicon carbide, zinc oxide, spinel, gallium phosphide, gallium arsenide, or indium phosphide.

Furthermore, one or more intermediate layers may be arranged between the carrier and the first layer, between the second layer and the first layer and/or between the third material and the second layer.

Each of the first and second layers may consist of one or more sublayers.

A further embodiment of the invention relates to a device comprising: a locally modified buried first layer, said first layer comprising at least one modified section and at least one un-modified section; a second layer which is arranged on top of the first layer; wherein the modified material of the locally modified buried first layer changes or induces mechanical strain in a portion of the second layer which is arranged above the at least one modified section; and wherein at least one nanostructure is placed on top of the second layer in an area, which is located above the at least one unmodified section of the first layer or adjacent thereto.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout. It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

An exemplary embodiment of a method for fabricating at least one photon emitter will be explained hereinafter referring to FIGS. 1-8.

Figure 1:
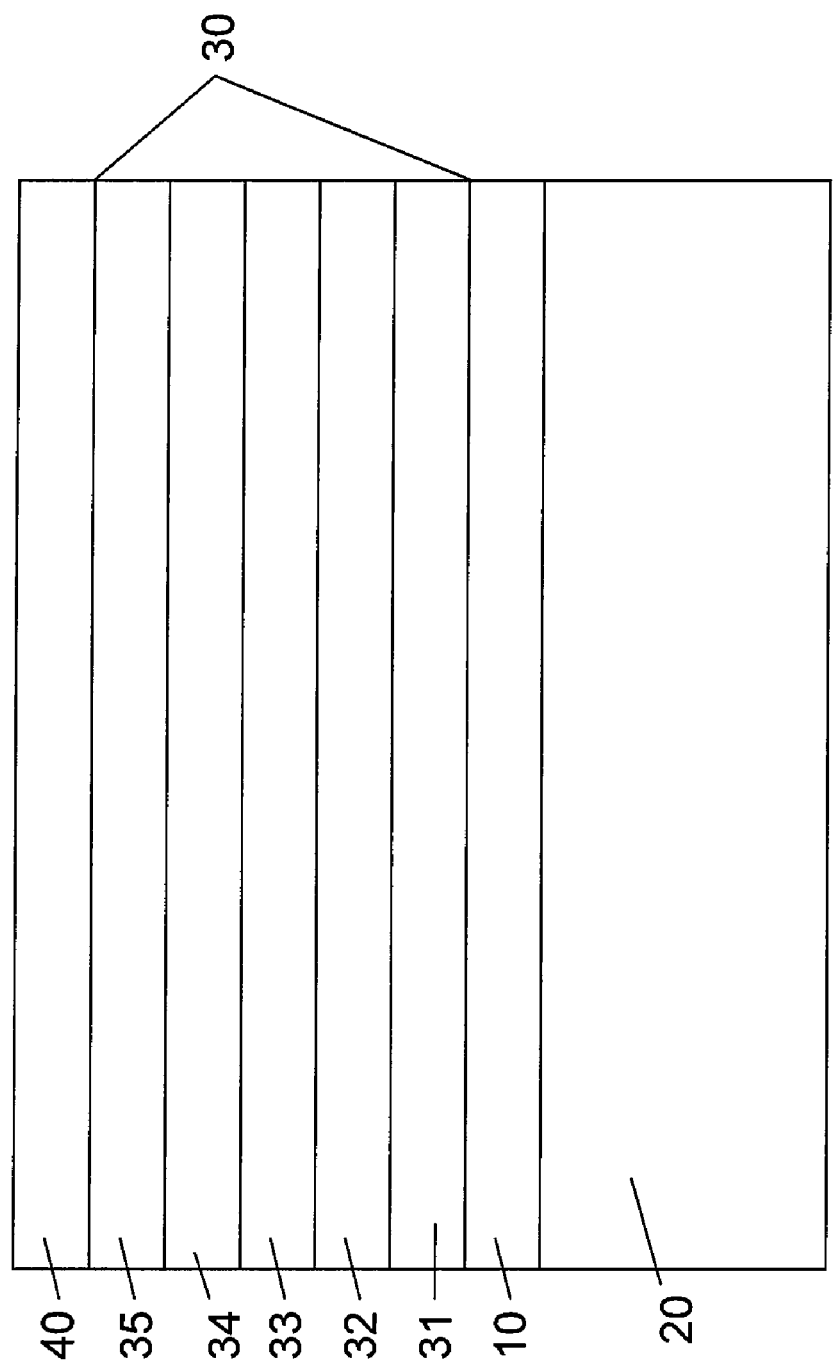
FIG. 1 shows in an exemplary fashion a layer stack for fabricating a single photon emitter.

As shown in FIG. 1, a GaAs intermediate buffer layer 10 is grown by metalorganic vapor phase epitaxy (MOVPE) on a carrier 20. The carrier 20 may consist of or comprise a vicinal GaAs(001) substrate 20. The MOVPE step may be carried out in a commercial Aixtron AIX200/4 reactor. The growth conditions may be chosen similar to standard growth conditions for MOVPE growth of AlAs/GaAs as known in the art. Other epitaxial growth techniques and their respective growth conditions are contemplated as well.

Then, a first layer 30 is deposited on the intermediate buffer layer 10. The first layer 30 may consist of a plurality of AlGaAs-sublayers. For instance, the first layer 30 may comprise a graded $Al_{0-0.9}Ga_{1-0.1}As$ sublayer 31 (preferred thickness between 1 nm and 100 nm, e.g. 30 nm), an $Al_{0.9}Ga_{0.1}As$ sublayer 32 (preferred thickness between 10 nm and 100 nm, e.g. 40 nm), an AlAs sublayer 33 (preferred thickness between 1 nm and 100 nm, e.g. 30 nm), an $Al_{0.9}Ga_{0.1}As$ sublayer 34 (preferred thickness between 10 nm and 100 nm, e.g. 40 nm), and an oppositely graded $Al_{0.9-0}Ga_{0.1-1}As$ sublayer 35 (preferred thickness between 1 nm and 100 nm, e.g. 30 nm).

The growth is concluded by depositing a second layer 40 which may consist of a GaAs material (preferred thickness between 5 nm and 200 nm, e.g. 100 nm). The resulting layer structure is shown in FIG. 1.

Figure 2:
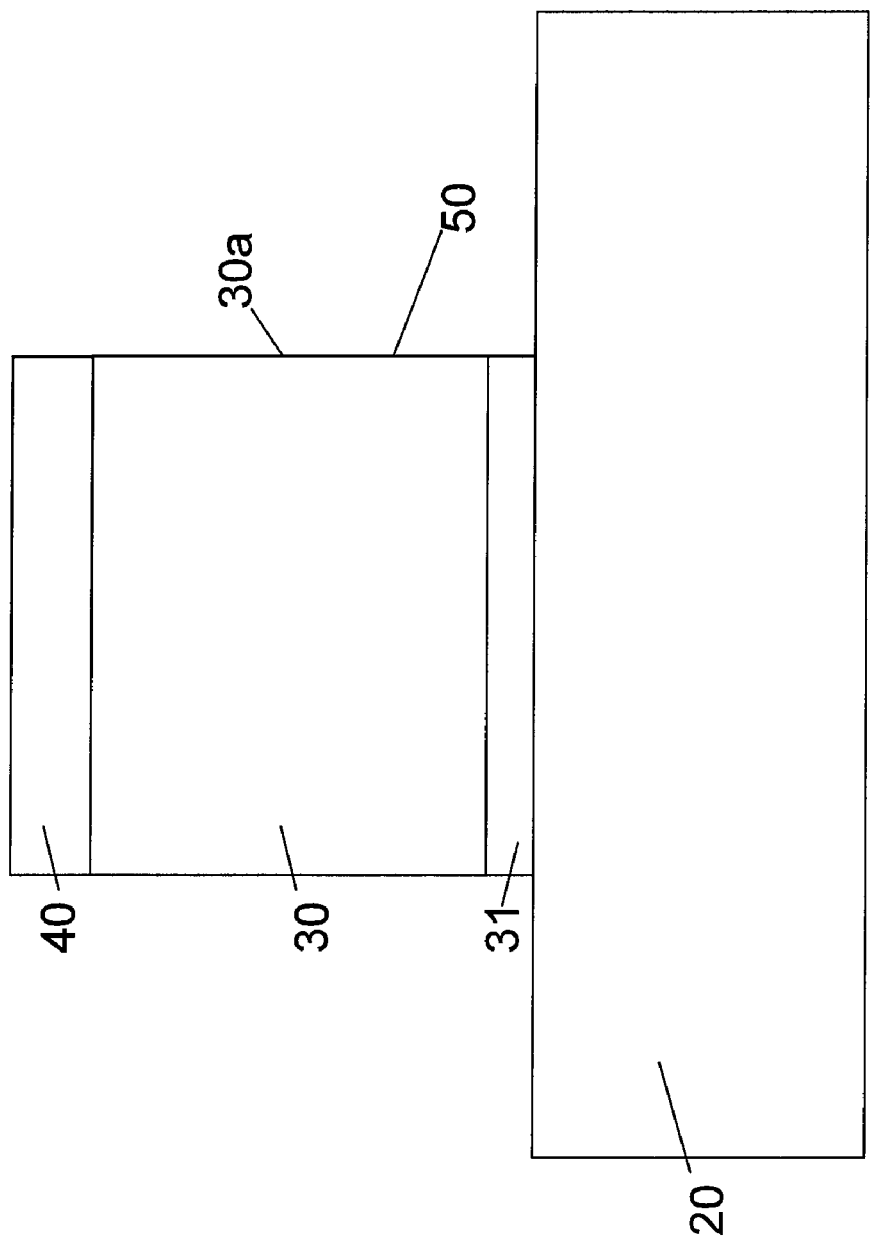
FIG. 2 shows the layer stack of FIG. 1 after etching a mesa structure.

Referring to FIG. 2, after the epitaxy, a circular mesa structure 50 of 15-25 μm diameter is defined by conventional photolithography and reactive ion etching, for example. The mesa height is preferably chosen such that the side facets 30a of the first layer 30 are completely or at least partly exposed.

Figure 3:
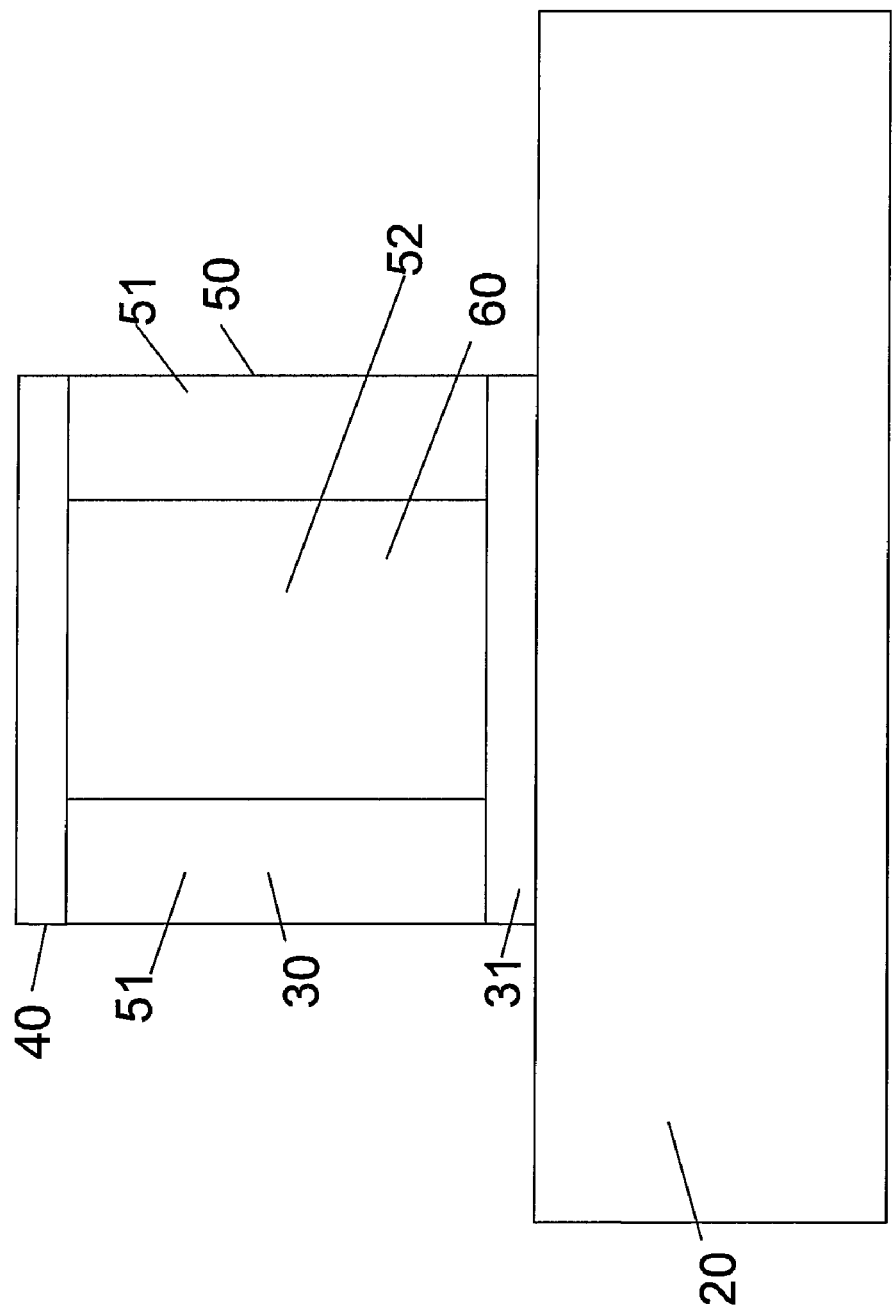
FIG. 3 shows the mesa structure of FIG. 2 after oxidizing an outer section thereof.

Afterwards, the material of the exposed side facets 30a of the first layer 30 is oxidized into $AlO_x$ as shown in FIG. 3. The oxidation may be carried out using nitrogen as carrier gas and water vapor as oxidizing agent. During oxidation, the reactor may be held at 50 mbar total pressure while the mesa structure 50 is heated to 450° C. A mixture of 3 slpm nitrogen and 50 sccm water vapor is then supplied to the mesa structure 50. These conditions lead to a reaction-rate controlled anisotropic oxidation of the first layer 30. The oxidation is preferably stopped at an oxidation depth of 7-8 μm. The resulting inner contour of the oxidized layer is square-like due to the anisotropic character of the oxidation. Other inner contours of the oxidized layer may be obtained using other mesa shapes and/or other oxidation conditions.

In case of an isotropic oxidation, the outer contour of the mesa structure 50 that is defined by photolithography and etching, decides about the inner contour of the oxidized layer. As such, in case of isotropic oxidation, the outer contour of the mesa structure preferably comprises at least one corner in order to obtain an inner contour with at least one corner. For instance, if one likes to achieve a square-like inner contour a square-like outer contour needs to be chosen for the mesa structure 50.

The oxidation of the buried first layer 30 forms an outer section 51 adjacent to the outer surface of the mesa structure 50. The outer section 51 provides a high electrical resistance due to the oxidation, and embraces an inner section 52 of the mesa structure 50. The inner section 52 remains unchanged (not-oxidized) and preferably exhibits a low electrical resistance due to sufficient doping. As such, the inner section 52 forms a current aperture 60 having a cornered (e.g. square-like) shape.

Figure 4:
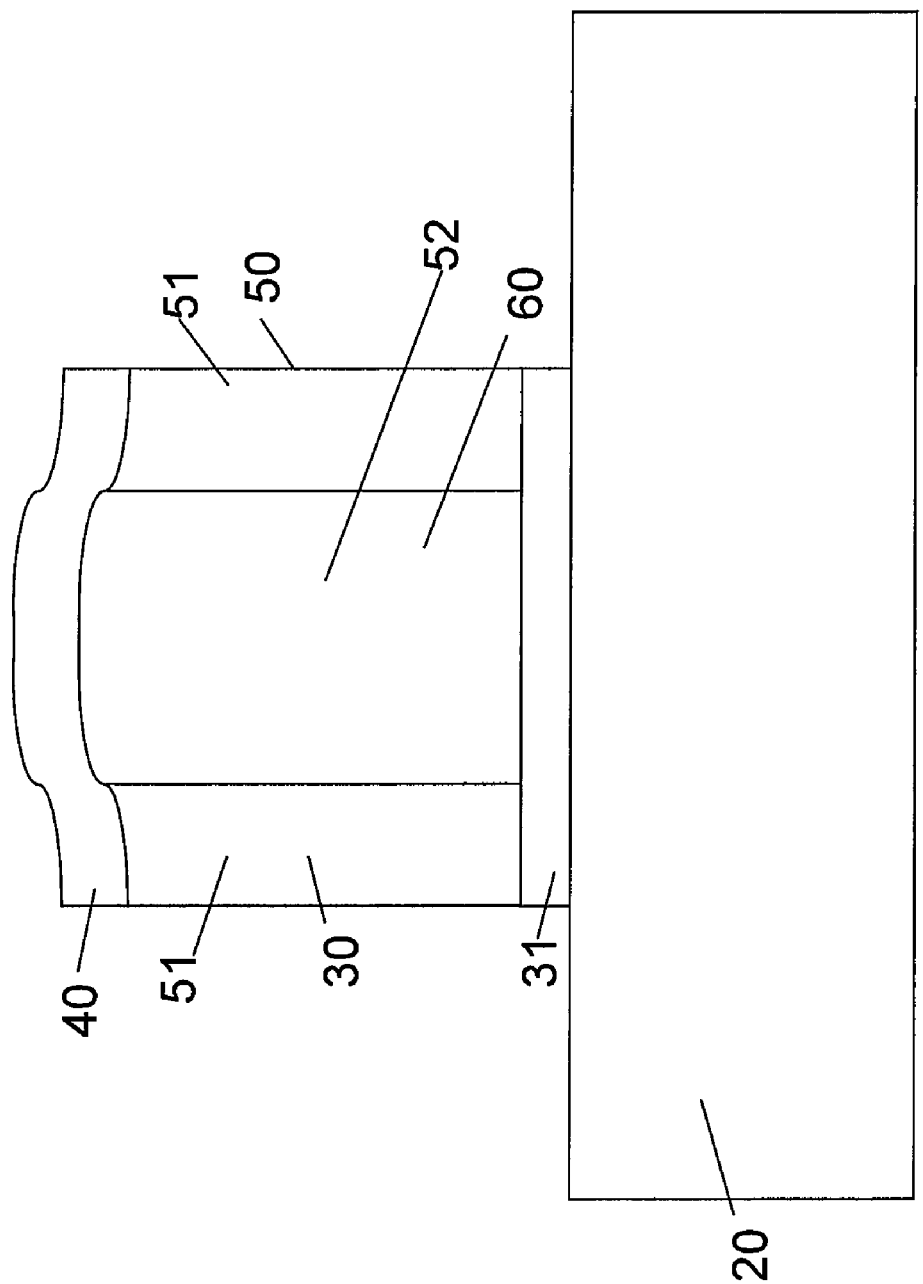
FIG. 4 shows the curved surface of the mesa structure of FIG. 3 after the oxidation in a schematic fashion.
Figure 5:
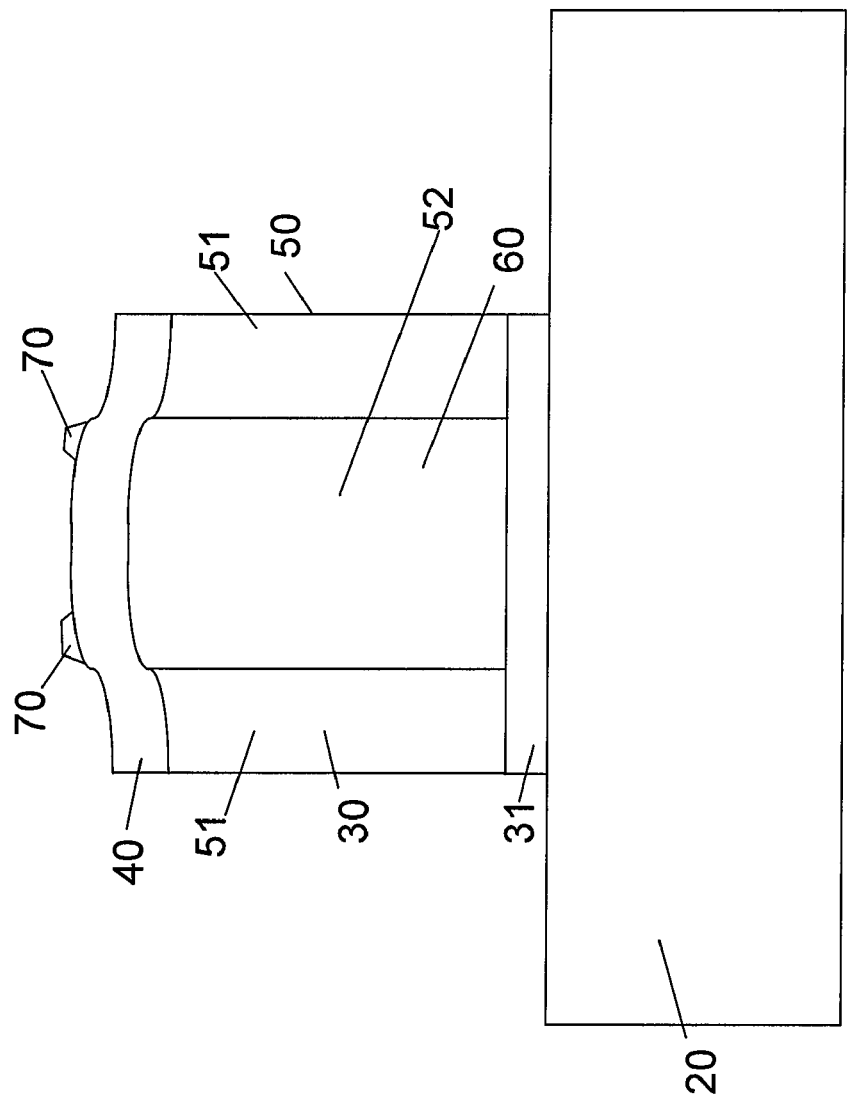
FIG. 5 shows the mesa structure of FIG. 4 after depositing nanostructures.

As shown in a schematic fashion in FIG. 4, the oxidation leads to a surface height modulation of the second layer 40 over the aperture 60. The surface height modulation results from the fact that the oxidation of the buried first layer 30 decreases the volume of the material in the outer section 51 and thereby locally induces mechanical strain inside the second layer 40.

Figure 8:
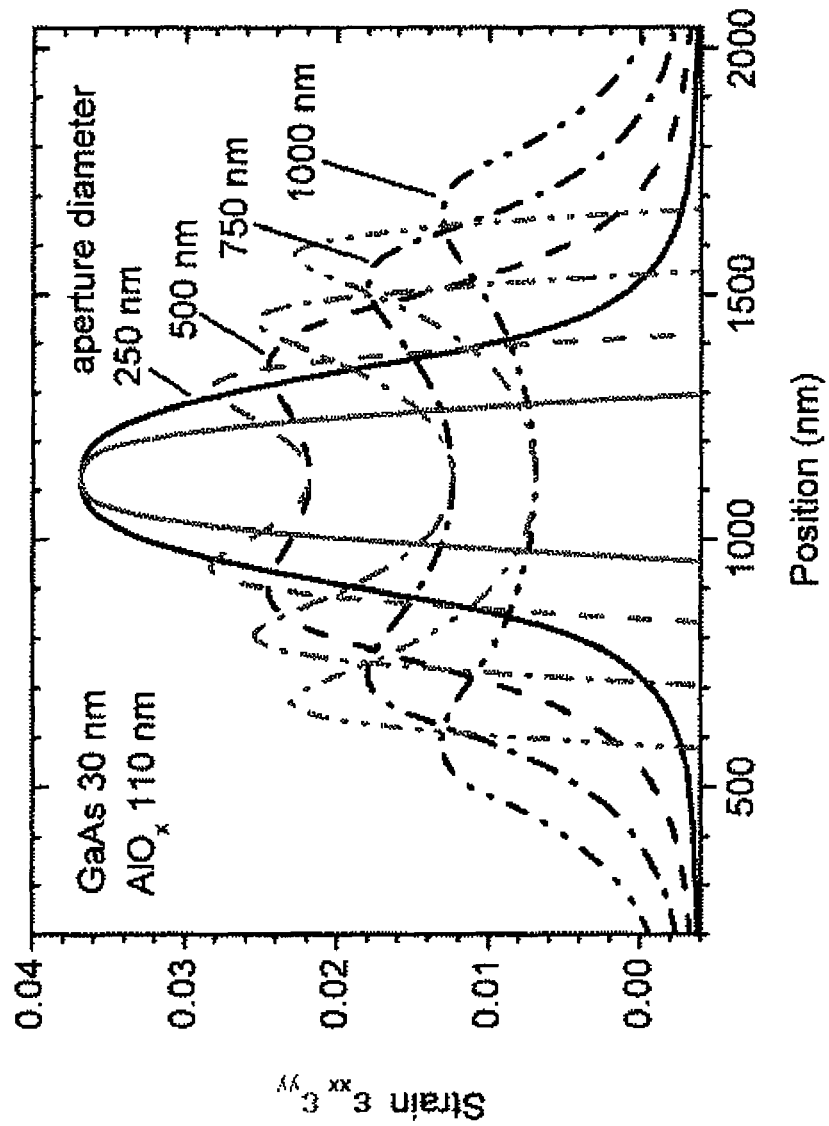
FIG. 8 shows the calculated strain distribution in the mesa structure of FIG. 7.

The distribution of the mechanical strain $\epsilon_{xx}$ and $\epsilon_{yy}$ at the surface of the second layer 40 is shown in FIG. 8 for different diameters of the current aperture 60. It can be seen that the strain and the strain distribution can be adjusted by choosing appropriate diameters. A long-range impact of the order of 50-300 nm of the strain along the surface normal is also observed.

The oxidized mesa structure 50 is then loaded back into a MOVPE reactor for subsequent overgrowth with at least one semiconductor nanostructure with quantized energy levels.

The semiconductor nanostructure growth sequence may start with a bake out at a temperature between 700° C. and 800° C. (preferably 715° C.) for 5 minutes under arsenic atmosphere followed by growth of a GaAs buffer layer (preferred thickness between 10 nm and 100 nm, e.g. 50 nm; preferred growth temperature between 600° C. and 700° C., e.g. 685° C.). The mentioned GaAs-buffer layer is preferred but not mandatory, and is therefore not shown in the Figures.

The temperature is subsequently lowered to approximately 500° C. (e.g. 515° C.) for nanostructure growth. The nanostructures are obtained after initial deposition of a 2 monolayer thick $In_{0.75}Ga_{0.25}As$ layer which is about the critical thickness for a 2D/3D transition (see FIG. 5). The transition from a two-dimensional layer to a three-dimensional nanostructure is governed by the Stranski-Krastanov growth. Under the conditions described above the nanostructure densities is typically in the range between $10^8$ cm$^{-2}$ and $10^7$ cm$^{-2}$. The resulting nanostructures are marked with reference numeral 70 in FIG. 5.

Figure 6:
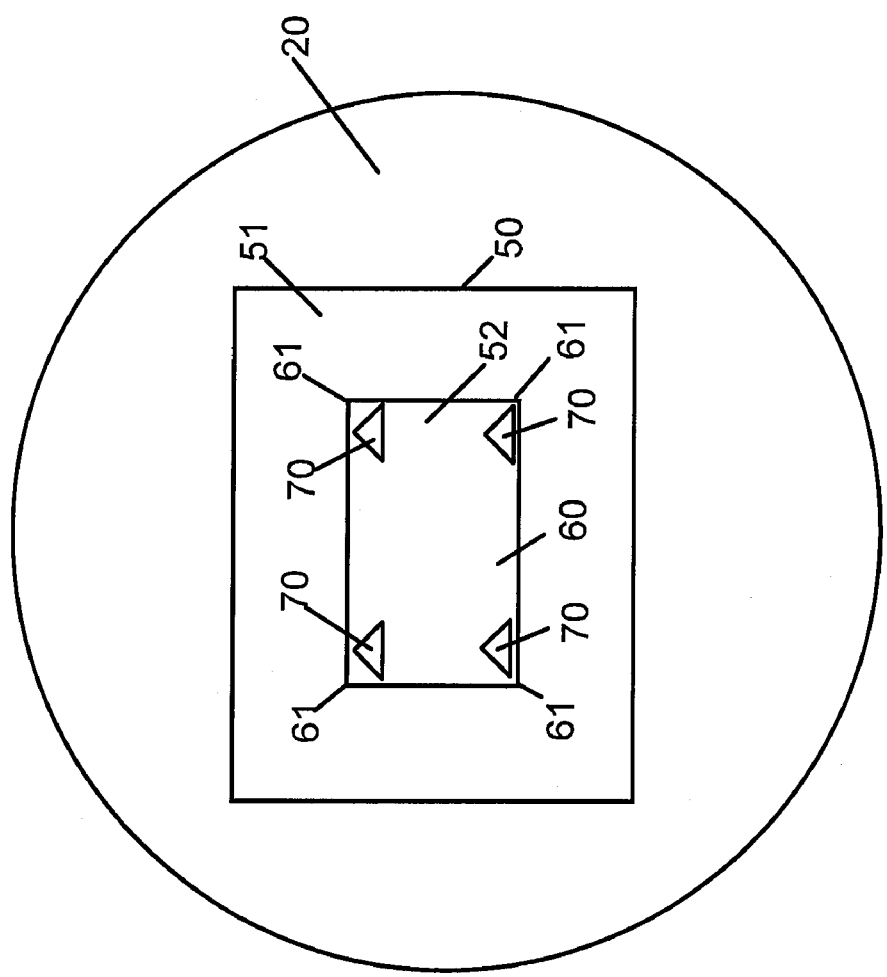
FIG. 6 shows the mesa structure of FIG. 4 including the nanostructures in a top view.

FIG. 6 shows a top view of the oxidized mesa structure 50, the buried square-like current aperture 60, and the nanostructures 70 on top of the second layer 40. The nanostructures 70 are primarily formed above the corners 61 of the square-like current aperture 60 due to the mechanical strain enhancement which is localized in the corners 61.

Figure 7:
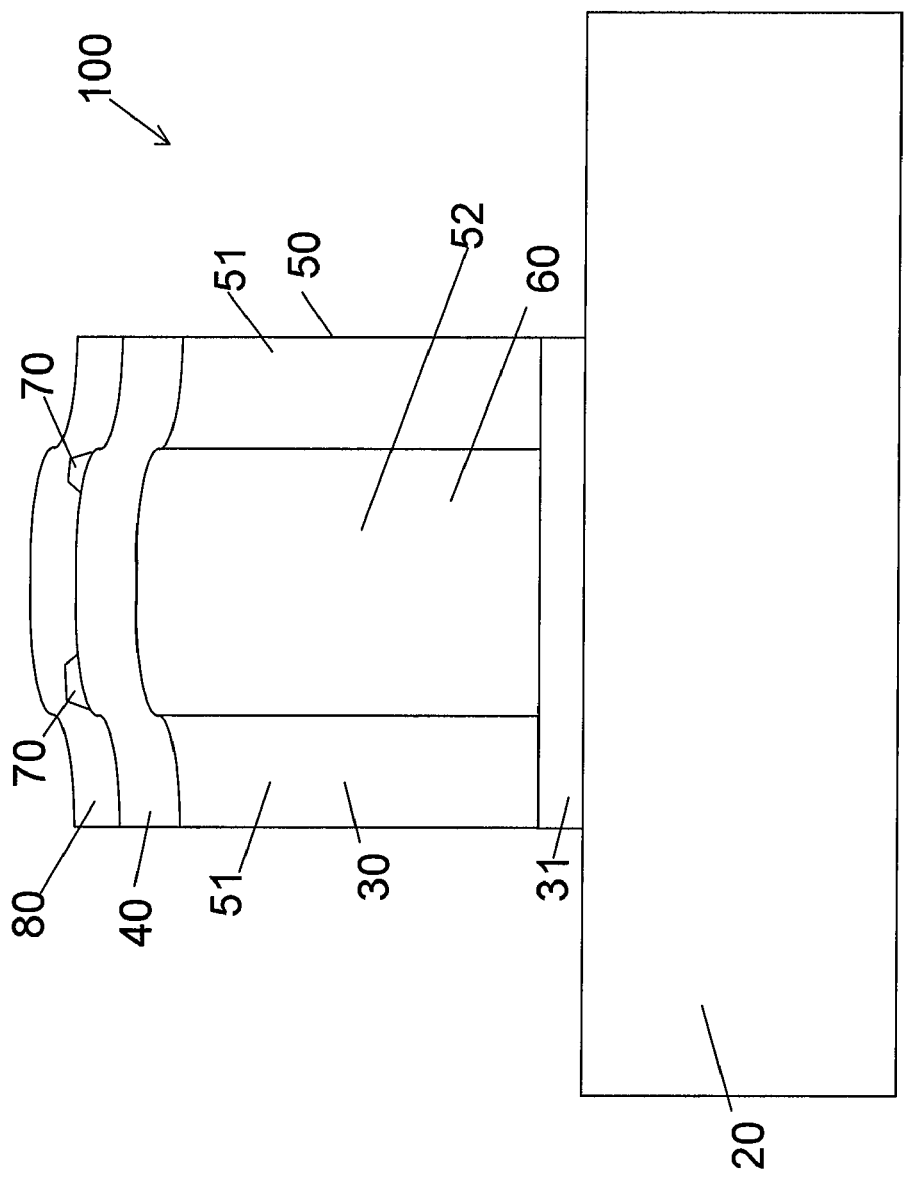
FIG. 7 shows the mesa structure including the nanostructures of FIG. 5 after depositing a cap layer.

Preferably, a growth interruption without arsenic stabilization may be applied afterwards before finally growing a GaAs cap layer 80 (preferred thickness between 1 nm and 100 nm, e.g. 40 nm). The resulting photon emitter device 100 is shown in FIG. 7 before adding electrical contacts.

The method as described above yields a plurality of advantages compared to prior art methods:

1. The nanostructures 70 may be deposited on an unstructured surface of the second layer 40. The local arrangement of the nanostructures 70 is defined by mechanical strain caused by the buried first layer 30 which is located below the second layer 40. As such, the nanostructures 70 may grow on a surface which is defect-free or at least may be almost defect-free.

2. The inner section 52 of the mesa structure 50 provides self-alignment of the current aperture 60 with respect to the nanostructures 70. Therefore, the nanostructures 70 are automatically positioned above the current aperture 60 and subject to focused current injection. The efficiency of the current injection is thus optimized.

3. The local arrangement of the nanostructures on a nanometer scale is obtained without using complex lithographic and etching procedures to prepare nanometer-sized surface areas.

REFERENCE SIGNS 10 buffer layer
20 carrier
30 first layer
30a side facet
31-35 sublayers of the first layer
40 second layer
50 mesa structure
51 outer section
52 inner section
60 current aperture
61 corner
$\epsilon_{xx}$, $\epsilon_{yy}$ mechanical strain
70 nanostructure
80 cap layer
100 photon emitter device

The invention claimed is:

1. Method of fabricating a layer assembly comprising the steps of:
arranging a first layer on top of a carrier;
arranging a second layer on top of the first layer;
locally modifying the material of the buried first layer and providing at least one modified section in the first layer, wherein the modified material changes or induces mechanical strain in a portion of the second layer which is arranged above the at least one modified section; and,
after locally modifying the material of the buried first layer, depositing a third material on top of the second layer, at least one characteristic of the third material being sensitive to the local mechanical strain in the second layer;
wherein at least one nanostructure is formed on top of the second layer in an area, which is located above an unmodified section of the first layer, by depositing the strain-sensitive third material on the locally strained second layer.

2. Method of claim 1 wherein a portion of the second layer is removed to expose the buried first layer.

3. Method of claim 2 wherein a portion of the buried first layer is chemically modified by applying at least one chemical to the exposed portion of the buried first layer, prior to depositing the strain-sensitive third material.

4. Method of claim 2 wherein by removing said portion of the first and second layers, a mesa structure is provided that includes the buried first layer and the second layer.

5. Method of claim 4 wherein said chemical is applied to the exposed portion of the mesa structure prior to depositing the third material.

6. Method of claim 5 wherein
said chemical modifies the material of the buried first layer in an outer section adjacent to the outer surface of the mesa structure, said outer section embracing an inner section of the mesa structure, whereas the material of the buried first layer in the inner section of the mesa structure remains unchanged.

7. Method of claim 6 wherein
the inner contour of the outer section comprises at least one corner.

8. Method of claim 7 wherein the material of the buried first layer in the outer section is oxidized, nitridated, or carbonized.

9. Method of claim 7 wherein the modification of the material of the buried first layer in the outer section increases or decreases the volume of the material in the outer section and thereby locally induces mechanical strain inside the second layer.

10. Method of claim 7 wherein at least one nanostructure is formed on top of the second layer in an area, which is located above the inner unmodified section of the first layer or at least adjacent thereto, by depositing the third material on the locally strained second layer.

11. Method of claim 10 wherein the deposition of the strain-sensitive material forms at least one semiconductor nanostructure with quantized energy levels.

12. Method of claim 10 further comprising the step of adding electrical contacts which allow applying an electrical voltage.

13. Method of claim 10 wherein said at least one nanostructure forms a single photon emitter.

14. Method of claim 10 wherein the modification of the material of the buried first layer in the outer section decreases the electrical conductivity in the outer section such that the inner section of the buried first layer forms a current guiding aperture that is positioned below the at least one nanostructure.

15. Method of claim 1 wherein the material of the buried first layer is Al(Ga)As-material or AlInN-material.

16. Method of claim 1 wherein at least one intermediate layer is arranged between the carrier and the first layer, between the second layer and the first layer and/or between the third material and the second layer.

17. Method of claim 1 wherein the layer assembly including said at least one nanostructure forms at least one photon emitter.

* * * * *